United States Patent
Arsovski et al.

(10) Patent No.: US 9,542,981 B2
(45) Date of Patent: Jan. 10, 2017

(54) SELF-TIMED, SINGLE-ENDED SENSE AMPLIFIER

(71) Applicant: INTERNATIONAL BUSINESS MACHINES CORPORATION, Armonk, NY (US)

(72) Inventors: Igor Arsovski, Williston, VT (US); Travis R. Hebig, Rochester, MN (US)

(73) Assignee: GLOBALFOUNDRIES INC., Grand Cayman (KY)

(*) Notice: Subject to any disclaimer, the term of this patent is extended or adjusted under 35 U.S.C. 154(b) by 285 days.

(21) Appl. No.: 13/972,149

(22) Filed: Aug. 21, 2013

(65) Prior Publication Data

US 2015/0055389 A1    Feb. 26, 2015

(51) Int. Cl.
| | | |
|---|---|---|
| G11C 7/00 | (2006.01) | |
| G11C 7/08 | (2006.01) | |
| G11C 15/04 | (2006.01) | |
| G11C 7/12 | (2006.01) | |
| G11C 16/10 | (2006.01) | |
| G11C 16/04 | (2006.01) | |
| G11C 16/24 | (2006.01) | |
| G11C 16/26 | (2006.01) | |
| G11C 16/34 | (2006.01) | |
| G11C 7/06 | (2006.01) | |
| G11C 11/419 | (2006.01) | |

(52) U.S. Cl.
CPC .............. *G11C 7/08* (2013.01); *G11C 7/067* (2013.01); *G11C 7/12* (2013.01); *G11C 11/419* (2013.01); *G11C 15/04* (2013.01); *G11C 16/0483* (2013.01); *G11C 16/10* (2013.01); *G11C 16/24* (2013.01); *G11C 16/26* (2013.01); *G11C 16/3418* (2013.01); *Y10T 29/49117* (2015.01)

(58) Field of Classification Search
CPC ...... G11C 16/24; G11C 16/10; G11C 16/3418; G11C 16/0483; G11C 16/26
USPC ............... 365/49.17, 49.1, 189.06, 203
See application file for complete search history.

(56) References Cited

U.S. PATENT DOCUMENTS

| | | | |
|---|---|---|---|
| 5,929,660 A | 7/1999 | Dillinger | |
| 6,021,072 A * | 2/2000 | Takeda | G11C 7/12 365/185.25 |
| 6,181,591 B1 * | 1/2001 | Miyatake et al. | 365/49.1 |
| 6,219,290 B1 * | 4/2001 | Chang | G11C 7/062 365/185.21 |
| 6,297,670 B1 | 10/2001 | Chao et al. | |
| 6,301,175 B1 | 10/2001 | Seyyedy et al. | |
| 6,493,790 B1 * | 12/2002 | Khieu et al. | 711/108 |

(Continued)

OTHER PUBLICATIONS

Anonymous; "Method for a NonStrobe-Sensing Scheme for SRAM", IPCOM000009516D, Aug. 28, 2002; 9 Pages.

(Continued)

*Primary Examiner* — Pho M Luu
(74) *Attorney, Agent, or Firm* — David Cain; Andrew M. Calderon; Roberts Mlotkowski Safran Cole & Calderon, P.C.

(57) ABSTRACT

An integrated circuit including a sense amplifier connected to a sense line is provided. The sense amplifier is configured to end a precharge phase of the sense line based on a state of the sense amplifier. A single-ended sense amplifier determines its own precharge level, ends the precharge phase, and starts evaluation as soon as precharge is ended, without waiting for a globally timed signal to end the precharge phase.

20 Claims, 9 Drawing Sheets

(56) References Cited

U.S. PATENT DOCUMENTS

| | | | |
|---|---|---|---|
| 6,496,399 B1* | 12/2002 | Choi et al. ............... 365/49.17 |
| 7,196,548 B2 | 3/2007 | Anders et al. |
| 7,330,375 B2 | 2/2008 | Daga et al. |
| 7,453,742 B2* | 11/2008 | Maejima ............ G11C 16/24 |
| | | | 365/185.21 |
| 7,466,614 B2* | 12/2008 | Wang ................ G11C 7/067 |
| | | | 365/196 |
| 7,515,493 B2* | 4/2009 | Di Vincenzo ........ G11C 16/26 |
| | | | 365/203 |
| 7,529,145 B2* | 5/2009 | La Rosa ............ G11C 7/1036 |
| | | | 365/185.21 |
| 7,724,559 B2* | 5/2010 | Arsovski ............... 365/49.17 |
| 7,881,120 B2* | 2/2011 | Yoshihara ............ G11C 7/065 |
| | | | 365/185.21 |
| 8,305,814 B2 | 11/2012 | Ali et al. |
| 8,339,884 B2* | 12/2012 | Huang ................ G11C 7/067 |
| | | | 365/185.25 |
| 8,385,128 B2* | 2/2013 | Mori .................. G11C 7/18 |
| | | | 365/185.21 |
| 8,605,521 B2* | 12/2013 | Vimercati .......... H03F 3/45762 |
| | | | 365/189.15 |
| 8,687,398 B2* | 4/2014 | Chang et al. ............ 365/49.15 |
| 8,693,260 B2* | 4/2014 | Lin ................... G11C 7/12 |
| | | | 365/185.25 |
| 8,885,427 B2* | 11/2014 | Kim ................... G11C 7/00 |
| | | | 365/154 |
| 9,224,427 B2* | 12/2015 | Black ................. G11B 27/28 |
| 2003/0107934 A1 | 6/2003 | Chang |
| 2005/0110527 A1 | 5/2005 | Tam et al. |
| 2008/0008007 A1* | 1/2008 | Mori ................. G11C 16/28 |
| | | | 365/185.23 |
| 2010/0054039 A1* | 3/2010 | Kim ................... G11C 7/067 |
| | | | 365/185.13 |
| 2011/0063892 A1 | 3/2011 | Kajigaya et al. |
| 2012/0092939 A1 | 4/2012 | Cheng et al. |

OTHER PUBLICATIONS

Anonymous; "Method for a Single-Ended Sensing Scheme for SRAM", IPCOM000010170D, Oct. 30, 2002; 4 Pages.

IBM, et al., "Sense System for Single-Ended Application in a Static Memory", IPCOM000061534D, Mar. 9, 2005; 3 Pages.

Anonymous; "Process Compensated Matchline Sensing for NOR Cell CAMs and TCAMs", IPCOM000220555D, Aug. 6, 2012; 3 Pages.

* cited by examiner

SELF-TIMED, SINGLE-ENDED SENSE AMPLIFIER

FIELD OF THE INVENTION

The invention relates to integrated circuit memory and, more particularly, to single ended sensing in integrated circuit memory.

BACKGROUND

Single ended sensing is often used with a matchline (ML) in Content Addressable Memory (CAM) and a bitline in eight-transistor Static Random-Access Memory (8T SRAM). Often, these lines are held low when idle to save leakage power. To perform an operation, the matchlines or bitlines are precharged and then evaluated (e.g., sensed).

As technology scales to submicron geometries, random device variation (RDV) is becoming more prominent. RDV of parameters such as transistor length, transistor width and transistor threshold voltage could be significant even in identically designed neighboring devices. The effects of RDV are especially evident in the design of semiconductor memories. Because most memories rely on sense amplifiers to detect small voltage signals on largely capacitive array lines, RDV in the memory cells as well as sense-amplifier devices can produce incorrect results. To improve reliability, memory designers tune their sensing circuits conservatively, thereby trading off performance in order to maintain a large sensing margin for reliable operation.

In advanced technologies (i.e. 100 nm and smaller gate geometry) RDV is becoming a major bottleneck for improving performance. As device variation increases, timing uncertainty for signal arrival and data capture increases, requiring larger data capture margins, and therefore limiting performance.

Due to its single-ended nature, the ML sensing performed during the CAM search operation is even more sensitive to RDV than the differential sensing used in the SRAM read circuitry. Thus, to maintain reliable operation, most ML sensing schemes employ full-swing sensing which is both slow and power-inefficient.

Self-referenced sense amplifiers address the problems associated with RDV by performing a self-calibration to their respective thresholds to reduce effects of random device variation between adjacent sense amplifiers. However, conventional self-referenced sense amplifiers require a globally timed signal, i.e., a clock-based signal that is applied to plural sense amplifiers, to stop the precharge phase and begin the evaluation phase. Using a globally timed signal causes a plurality of sense amplifiers to have the same amount of precharge time. However, due to process variations, some sense amplifiers may not require the full precharge time in order to reach their particular precharge level. This results in some sense amplifiers sitting idle in the precharge phase after they have reached their precharge level but before the globally timed signal turns off the precharge.

SUMMARY

In a first aspect of the invention, there is a method of manufacturing an integrated circuit. The method includes forming a single-ended sense amplifier connected to a sense line, wherein the sense amplifier is configured to end a precharge phase of the sense line based on a state of the sense amplifier.

In another aspect of the invention, there is integrated circuit including a sense amplifier connected to a sense line. The sense amplifier is configured to end a precharge phase of the sense line based on a signal that is generated internally within the sense amplifier.

In another aspect of the invention, there is method of evaluating a sense line in an integrated circuit. The method includes receiving a start signal at a sense amplifier, wherein the start signal is generated externally to the sense amplifier. The method also includes beginning a precharge phase of the sense line based on the receiving the start signal. The method additionally includes ending the precharge phase and beginning an evaluation phase based on a signal that is generated internally within the sense amplifier.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of self-timed, single-ended sense amplifier which comprises the structures of the present invention. In still further embodiments, a method in a computer-aided design system is provided for generating a functional design model of self-timed, single-ended sense amplifier. The method comprises generating a functional representation of the structural elements of the self-timed, single-ended sense amplifier.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuit memory and, more particularly, to single ended sensing in integrated circuit memory. According to aspects of the invention, a single-ended sense amplifier determines its own precharge level, ends the precharge phase, and starts evaluation as soon as precharge is ended, without waiting for a globally timed signal to end the precharge phase. In embodiments, a single-ended sense amplifier includes an inverter input that is precharged to its trip point, at which point the precharge operation is ended by circuitry within the sense amplifier. Output signals are self-timed and available as soon as an input matchline signal propagates through the sensing inverter, without having to wait for a timing edge of a globally timed signal. By utilizing self-timing, implementations of the invention provide single-ended sense amplifiers that are faster and more variation tolerant than single-ended sense amplifiers that are controlled by a globally timed signal to end the precharge phase.

Aspects of the invention are described herein with respect to sensing a matchline in a CAM. However, the invention is not limited to use with CAM, and implementations of the invention may be used with any desired sensing scheme, such as 8T SRAM, etc.

Figure 1:
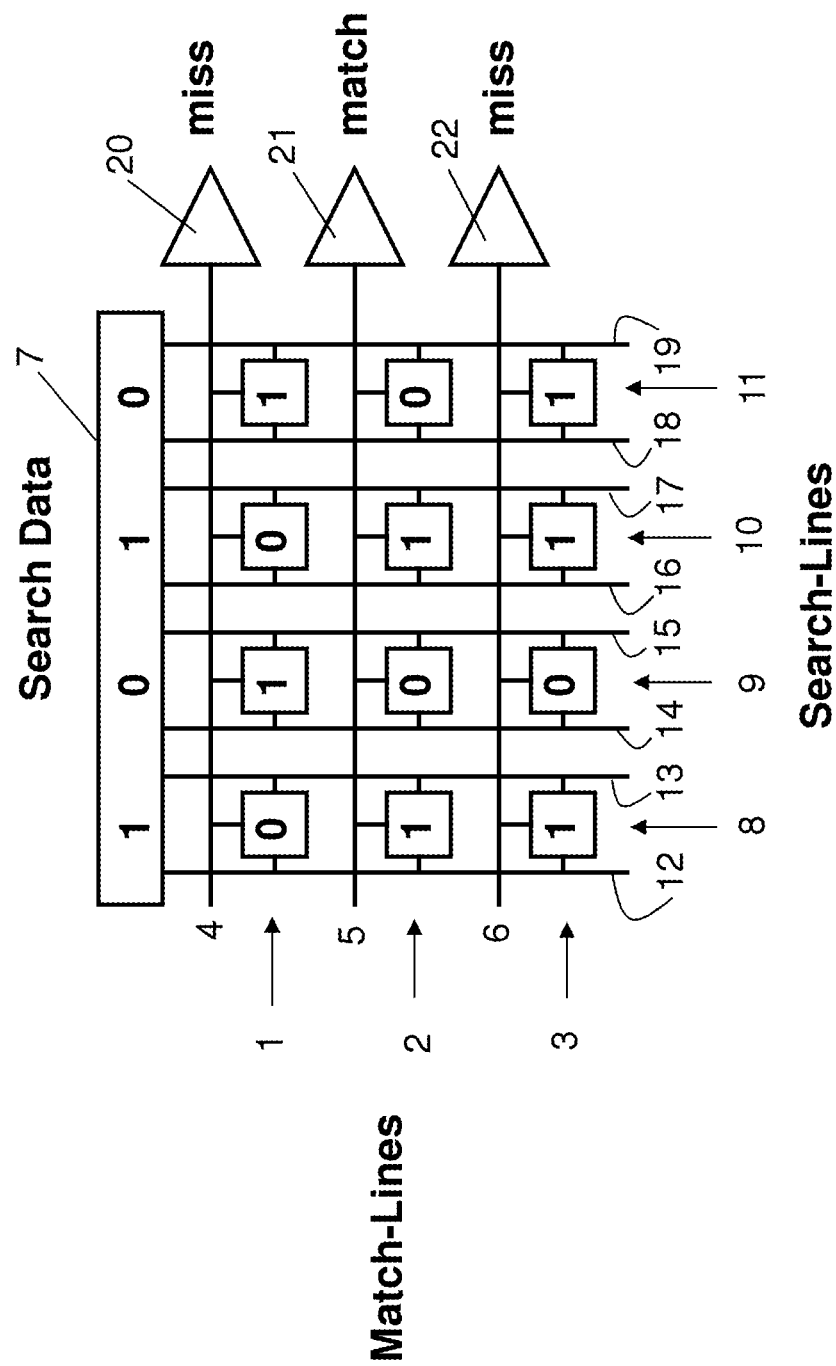
FIG. 1 shows a general architecture for a conventional CAM arrangement.

In a conventional CAM sensing scheme, as shown in FIG. 1, CAM core cells are arranged in horizontal rows, 1, 2, and 3, composed of, e.g., four cells, and each CAM core cell of a respective horizontal row is coupled to matchlines (MLs) 4, 5, and 6. As the number of cells in a row corresponds to the length of the word to be searched, any number of cells can be utilized by those ordinarily skilled in the art without departing from the spirit of the invention. Further, for the sake of easy explanation, only three MLs 4-6 are shown. Again, any number of MLs can be utilized by the ordinarily skilled artisan. Moreover, the CAM core cells are arranged in columns 8, 9, 10, and 11. While only four columns are shown, the number of columns corresponds to the number of bits in the CAM core cell word to be searched, such that any number of columns can be utilized.

Search data 7, i.e., the data word to be searched, is provided for comparison with each word formed in CAM rows 1-3. Parallel search lines 12-19 are coupled to search data 4, and each CAM core cell in a respective column is coupled to two search lines so that each cell corresponding to a data bit of the search data 7 can be searched for a match. Thus, search data 7 is applied to search lines 12-19 in parallel. Search results develop on MLs 4-6 in parallel and are applied to respective search amplifiers 20-22.

Figure 2:
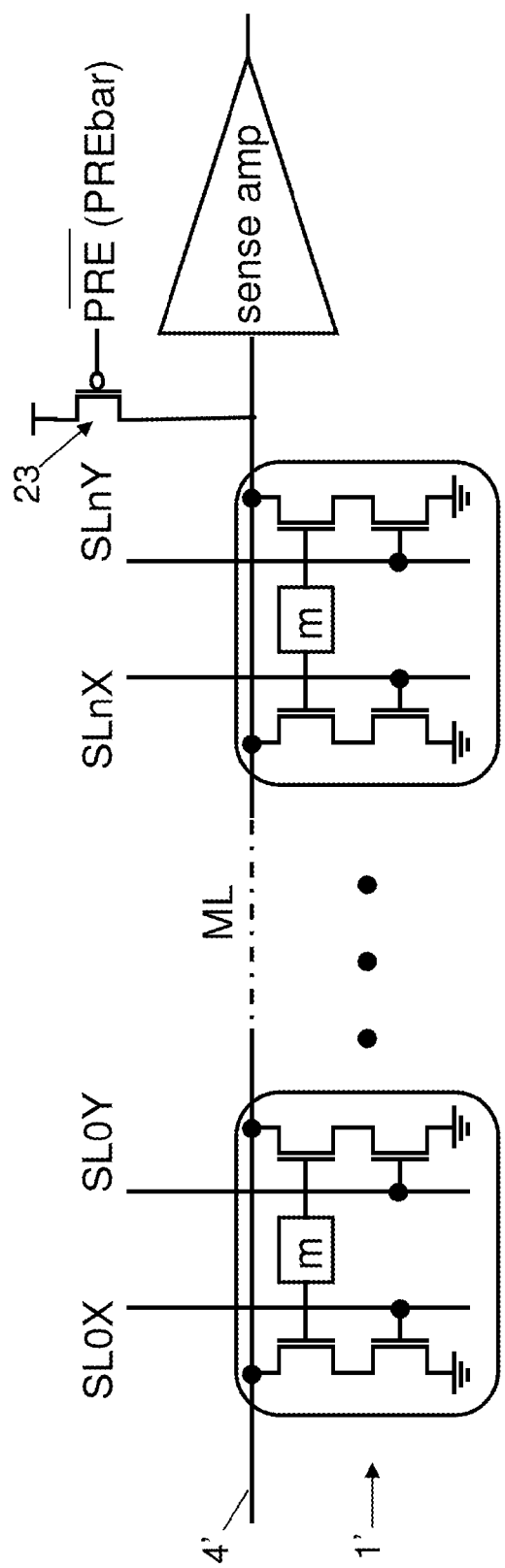
FIG. 2 illustrates a conventional CAM entry illustrating a ML architecture that can be used to sense a ML that is initially pre-charged high.

Conventional CAM searches have been performed with the MLs precharged high. As shown in FIG. 2, a conventional row 1' of CAM core cells to be searched is shown, and each cell of row 1' is coupled to a ML 4'. Moreover, each CAM core cell, which can be in binary or ternary form, includes a storage element "m", e.g., an SRAM or DRAM, and a pair of stacks of nFETs coupled between ML 4' and ground. The upper nFETs of each stack is coupled to storage element "m", while the lower nFETs are coupled to the pair of search lines associated with the cell column. For a search operation, search lines are initially set to ground, and the MLs are precharged high to Vdd, when a precharge bar signal (PREbar) is low to turn on pFET 23. To perform the comparison between the search to stored data the PREbar signal is raised high to stop the precharge and the search data is applied on the search lines, causing the results to develop on the MLs. If any bit in the storage elements does not match the respective searched bits of the search data, the precharged ML is pulled to ground through the mismatched nFET stacks, whereas, if all bits match the searched data, the precharged ML stays high. The signals on the MLs are applied to respective sense amplifiers, which differentiates whether the respective ML is at Vdd or ground.

The precharge bar signal (PREbar) is a globally timed signal, meaning that it is generated and/or controlled by logic external to the sense amplifier. Further, the globally timed PREbar signal is applied to plural sense amplifiers 20-22 and thus imposes a same precharge time on all of the sense amplifiers 20-22.

Figure 3A:
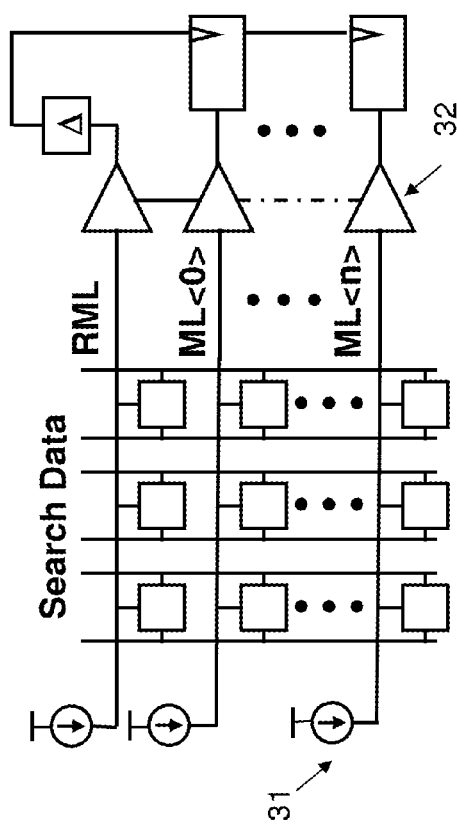
FIGS. 3a and 3b illustrate an alternative CAM array architecture and ML arrangement which can be used to sense a ML which is initially precharged low.
Figure 3B:
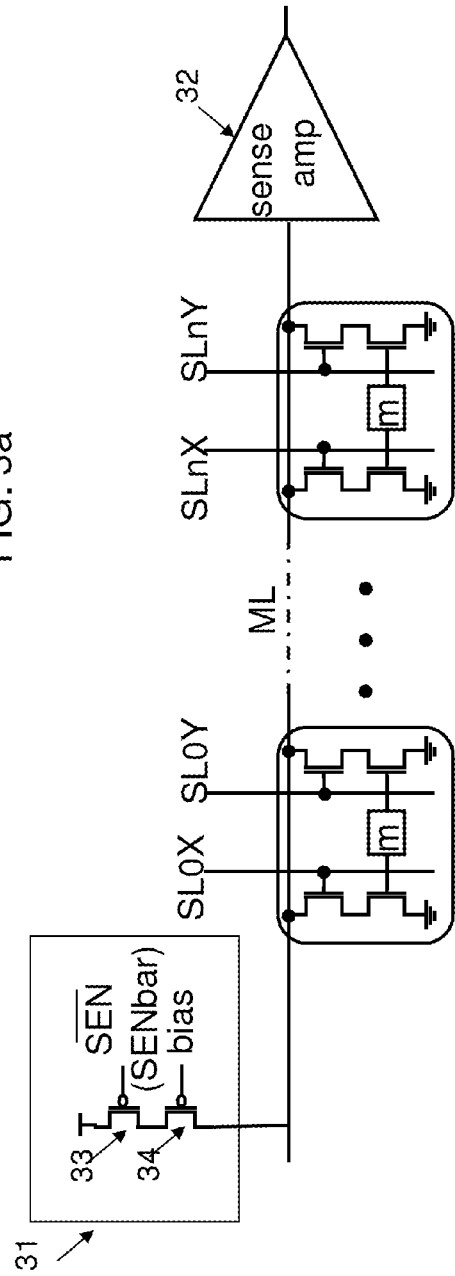

In an alternative conventional CAM search arrangement shown in FIGS. 3a and 3b, the MLs are initially precharged low. The arrangement depicted in FIG. 3a additionally includes an additional row provided as a reference ML RML, which develops at a same time as a full match. As shown in the figure, the sensing amplifier associated with RML is coupled to a latch to establish a search time corresponding to the time to reach the threshold voltage of the sensing amplifier. For a search, the MLs are initially set to ground, instead of Vdd as in FIG. 2, and equal currents are applied to them through a current source shown as 31.

For ease of explanation and illustration, FIG. 3b shows a single ML in which current source 31 can be formed by a stack of pFET devices 33 and 34. As illustrated, pFET 33 turns current source 31 "on" and "off" with the SENbar signal, while pFET 34 acts as a current limiting device to ensure correct differentiation between a match and a mismatch. As the voltage on the MLs increases, matches ramp up faster than mismatches, and the current race stops when RML voltage reaches the threshold voltage of its sense amplifier. At this point, the RML search amplifier generates the LATCH signal to capture all search results and complete the search operation, in which the voltage on all matched MLs would have crossed the threshold of their respective sense amplifiers, while the voltage on the mismatched MLs would have stayed below the threshold of their respective sense-amplifiers. Since the voltage swing on all MLs is reduced from Vdd to about ½ Vdd, and the precharge to ground statistically reduces search line switching activity by 50%, this search scheme significantly reduces power. Moreover, in contrast to the precharge-high ML configuration depicted in FIG. 2, in the precharge-low ML sensing scheme of FIG. 3b the nFET stacks within the CAM cells are reversed. In particular, the upper nFETs in the CAM cells are coupled to the pair of search lines associated with the cell column, while the lower nFETs are coupled to storage element "m".

The sense amplifiers for the above-noted conventional arrangements are very sensitive to variations in PMOS/NMOS skews and RDV which cause large sensing-circuit trip-point variation, which in turn demands large delay for reliable data capture timing and increased sense times. In contrast to the noted conventional arrangements, self-referenced sense amplifiers quickly precharge the MLs to the threshold of their respective sense amplifiers, release the precharge, develop ML signal, and finally sense the developed signal. By precharging each ML to the threshold voltage of its unique sense-amplifier, self-referenced sense amplifiers significantly reduce the timing uncertainty caused by the above-noted skews and large RDV.

Figure 4:
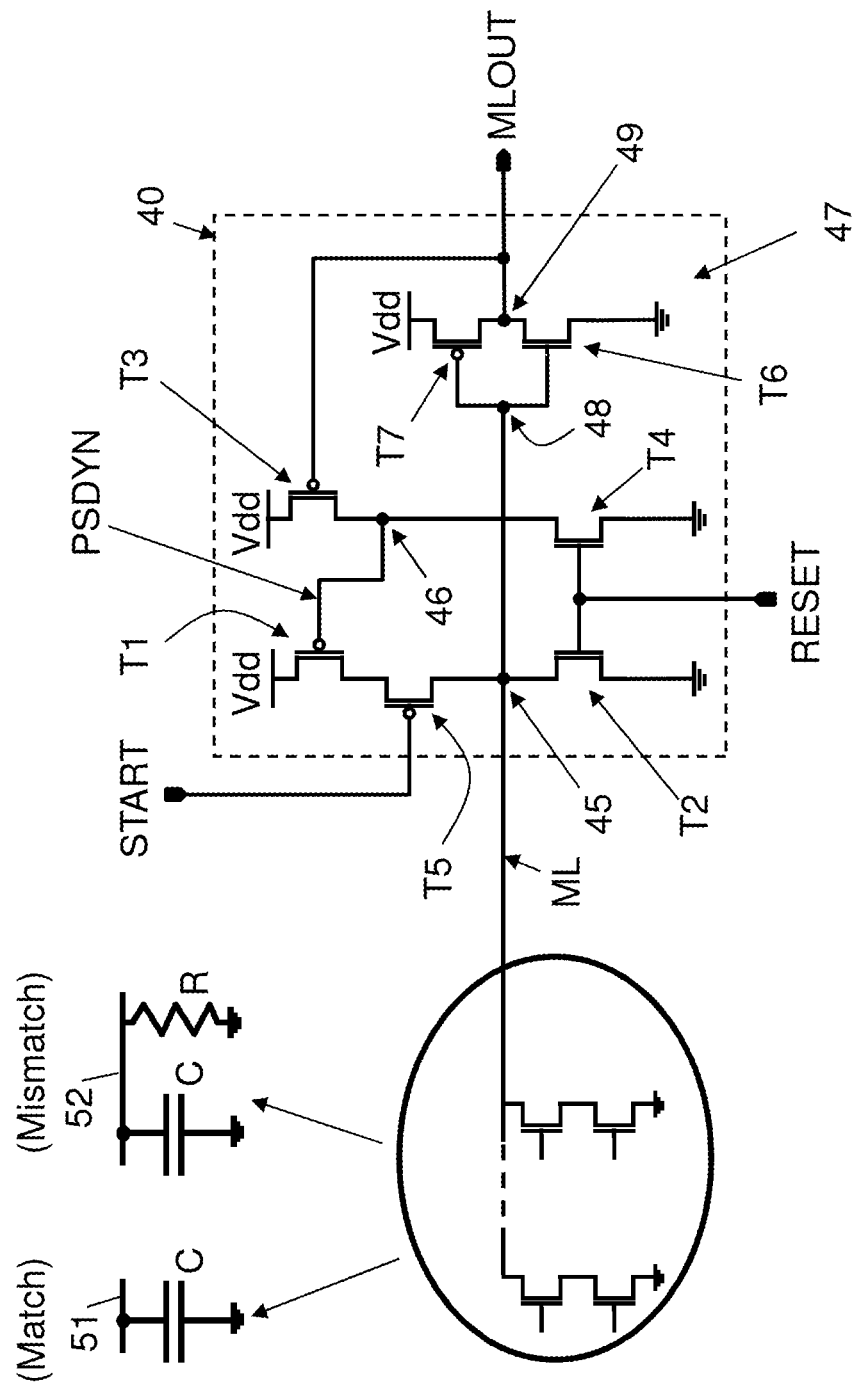
FIG. 4 illustrates a self-timed sense amplifier in accordance with aspects of the invention.

FIG. 4 shows a self-timed, single-ended sense amplifier 40 in accordance with aspects of the invention. The sense amplifier 40 is coupled to a sense line to determine the state of the sense line, in this example the sense line being the matchline (ML) of a CAM. In embodiments, sense amplifier 40 includes a pFET T1 and pFET T5 connected in series between Vdd and ML, e.g., at node 45. The sense amplifier 40 also includes nFET T2 connected between ML and ground. The sense amplifier 40 further includes pFET T3 and nFET T4 connected in series between Vdd and ground, without being directly connected to ML. A node 46 between pFET T3 and NFET T4 is connected to the gate of pFET T1. In embodiments, sense amplifier 40 includes an inverter 47 made up of, for example, pFET T7 and nFET T6 connected in series between Vdd and ground. An input 48 of inverter 47 is connected to ML. An output 49 of inverter 47 provides MLOUT, e.g., the sense determination of sense amplifier 40. In accordance with aspects of the invention, output 49 is also connected to the gate of pFET T3.

Still referring to FIG. 4, in accordance with aspects of the invention a START signal may be selectively applied to the gate of pFET T5, and a RESET signal may be selectively applied to the gates of nFET T2 and nFET T4. In embodiments, the START signal and RESET signal are controlled independently of each other by logic that is external to the sense amplifier, e.g., a control block or the like. In aspects of the invention, the START signal and RESET signal are digital control signals that may be set to a high state (e.g., Vdd) or a low state (e.g., 0 volts).

In the operation of sense amplifier 40, START and RESET both begin high (e.g., Vdd), with PSDYN and ML being low (e.g., 0). MLOUT is high at this time since MLOUT is the opposite of ML, which is currently low. Precharging of ML begins by transitioning both START and RESET from high to low. In particular, pFET T5 turns on when START goes low, and nFET T2 and T4 both turn off when RESET goes low. Since PSDYN is low, pFET T1 is already on when START and RESET go from high to low. Accordingly, bringing START low connects ML to Vdd via pFET T5 and pFET T1, and bringing RESET low disconnects ML and PSDYN from ground via nFET T2 and T4, all of which causes ML to begin transitioning from low to high, i.e., precharges ML. When transitioning from low to high, ML eventually reaches and passes the switch point (e.g., trigger voltage, threshold, etc.) of inverter 47, at which point MLOUT falls from high to low. MLOUT going low turns on pFET T3, which causes PSDYN to go from low to high. PSDYN going high turns off pFET T1, which ends the precharge phase of ML and begins the sense phase.

After the precharge has ended, in the event the CAM has a match, then ML stays high and MLOUT stays low. On the other hand, in the case of a mismatch (e.g., a miss), ML is pulled low due to the cell current pulling ML down, which causes MLOUT to go high when ML eventually falls below the switch point of inverter 47. In the case of a match, ML acts like a simple capacitor as schematically illustrated at 51. When mismatched, ML acts like a capacitor in parallel with a resistor as schematically illustrated at 52, where the resistor models a turned-on pull down device and pulls ML down.

Still referring to FIG. 4, to reset ML for the next cycle, START and RESET are transitioned from low to high, e.g., by an external control and/or based on a clock signal. In embodiments, START is transitioned from low to high prior to RESET being transitioned from low to high. In the singular case of an all-bit miss, START transitioning from low to high may stop the precharge current flow prior to ML exceeding the switch point of inverter 47, which, for purposes of this disclosure, is considered a reset of ML and the sense amplifier.

The sense amplifier 40 according to aspects of the invention is thus self-timed in that it automatically transitions from the precharge phase to the evaluate phase (e.g., sense phase) without requiring an external signal to cause the transition. The precharge phase is started by an external signal, e.g., the START signal; however, the precharge phase is ended (e.g., turned off) based on a signal that is generated internally in sense amplifier 40 (e.g., by MLOUT transitioning from high to low, which causes PSDYN to go from low to high, which turns off pFET T1, which ends the precharge of ML). The sense amplifier 40 according to aspects of the invention is also self-referenced in that it automatically determines its own precharge level, e.g., based on the switch point of inverter 47. In this manner, implementations of the invention provide a self-timed, self-referenced, single-ended sense amplifier 40 that: (i) determines its own precharge level; (ii) automatically ends the precharge phase; and (iii) automatically begins the evaluation (e.g., sense) phase, all without relying on external, globally timed signals.

The sense amplifier 40 is shown in FIG. 4 with a CAM implementation. However, the invention is not limited to use with CAM, and may be used with any integrated circuit line that requires single ended sensing. For example, sense amplifier 40 may be used to sense the read port (e.g., bitline) of an 8T SRAM, e.g., by tying START and RESET together.

Figure 5:
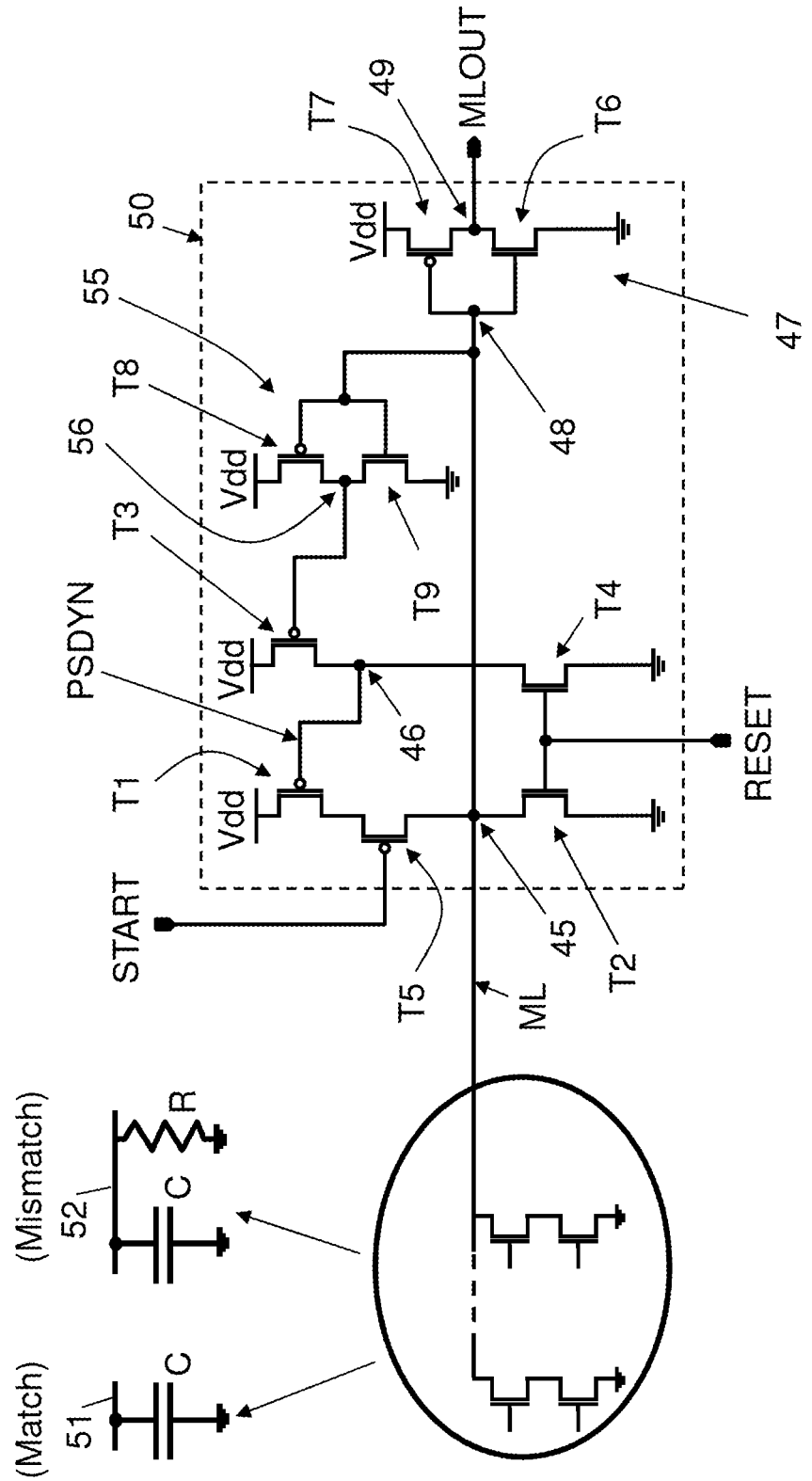
FIG. 5 illustrates an alternative arrangement of a self-timed sense amplifier in accordance with aspects of the invention.

FIG. 5 shows another embodiment of a sense amplifier 50 in accordance with aspects of the invention. The sense amplifier 50 includes some elements in common with sense amplifier 40 as indicated by like reference characters, the discussion of which is omitted for brevity. In embodiments, sense amplifier 50 includes another inverter 55 made up of pFET T8 and nFET T9 connected in series between Vdd and ground. The gate pFET T8 and the gate of nFET T9 are tied to ML. Node 56 between pFET T8 and nFET T9 is tied to the gate of pFET T3. In this configuration, inverter 55 sets the precharge level of ML, while inverter 47 sets the sense threshold.

In embodiments, the switch point of inverter 55 is set higher than the switch point of inverter 47. For example, the switch point of inverter 55 may be about 500 mV and the switch point of inverter 47 may be about 300 mV. In this manner, there is about a 200 mV difference between the ML precharge threshold and the sense threshold. This difference reduces or eliminates unwanted switching of inverter 47 during the evaluation phase due to noise on ML. The invention is not limited to the exemplary threshold values described herein, and any suitable values may be used. Moreover, inverter 47 and inverter 55 may be made to have programmable switch points.

Figure 6:
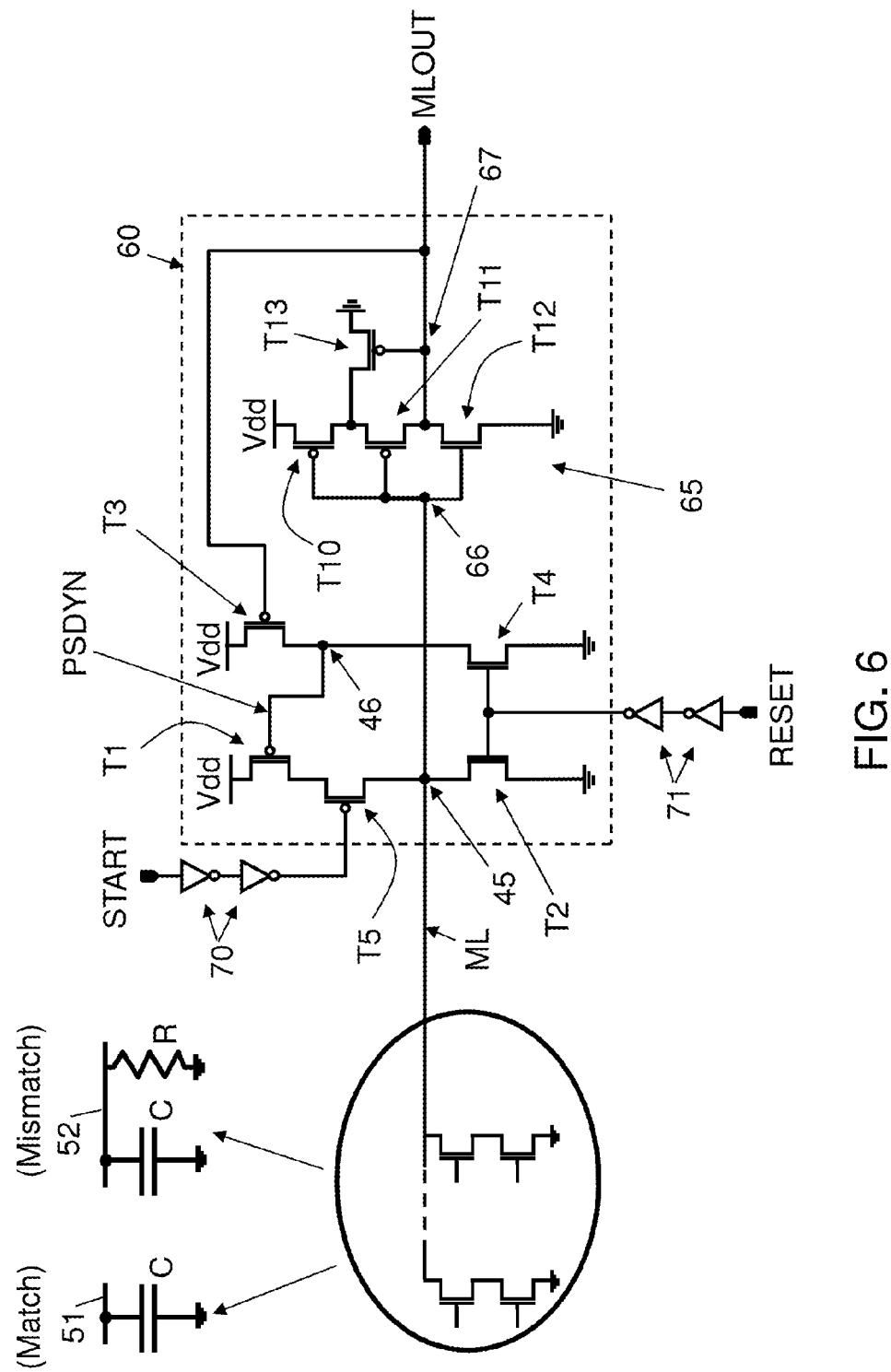
FIG. 6 illustrates an alternative arrangement of a self-timed sense amplifier in accordance with aspects of the invention.

FIG. 6 shows another embodiment of a sense amplifier 60 in accordance with aspects of the invention. The sense amplifier 60 includes some elements in common with sense amplifier 40 as indicated by like reference characters, the discussion of which is omitted for brevity. In embodiments, sense amplifier 60 includes a Schmitt trigger 65 whose input 66 is connected to ML and whose output 67 provides MLOUT. Output 67 is also tied to the gate of pFET T3. Any suitable Schmitt trigger may be used. For example, Schmitt trigger 65 may include pFET T10, pFET T11, and nFET T12 connected in series between Vdd and ground, with ML connected to the gate of each of pFET T10, pFET T11, and nFET T12. The Schmitt trigger 65 may also include pFET T13 connected to a junction between pFET T10 and pFET T11, with the gate of pFET T13 tied to a junction between pFET T11 and nFET T12.

As is understood by those of ordinary skill in the art, a Schmitt trigger may have a first switch point when transitioning in a first direction (e.g., from low to high), and a second, different switch point when transitioning in a second direction (e.g., from high to low). Accordingly, in embodiments, the transistors of Schmitt trigger 65 are configured such that Schmitt trigger 65 has a first switch point when ML is transitioning from low to high, and a second switch point when ML is transitioning from high to low. In aspects of the invention, the first switch point is higher than the second switch point. For example, the first switch point may be about 100 to 200 mV higher than the second switch point, although any suitable difference may be used. In this manner, the first switch point of Schmitt trigger 65 sets the precharge level of ML, and the second switch point of Schmitt trigger 65 sets the sense threshold.

Still referring to FIG. 6, the START and/or RESET signals may be tuned by adding tuning elements 70 and/or 71 to these lines. Tuning elements 70 and/or 71 are optional, and may be used in the embodiments shown FIGS. 4-6.

Figure 7:
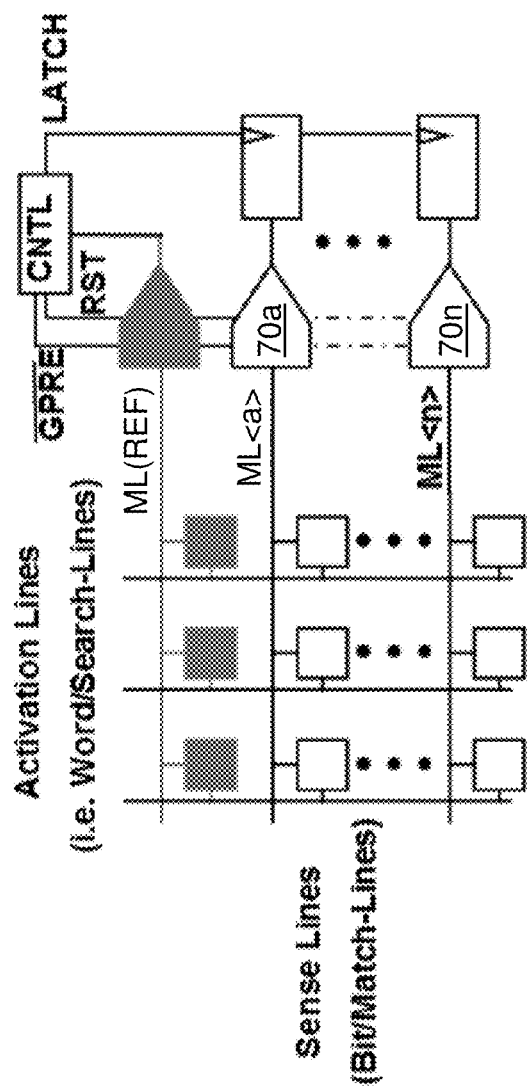
FIG. 7 shows an exemplary clocking scheme in accordance with aspects of the invention.

FIG. 7 shows an exemplary clocking scheme in accordance with aspects of the invention. In embodiments, a circuit includes sense amplifiers 70a . . . 70n connected to respective sense lines ML<a> . . . ML<n>, e.g., in a CAM implantation. Each one of sense amplifiers 70a . . . 70n may be a sense amplifier 40 as configured in FIG. 4, or a sense amplifier 50 as configured in FIG. 5, or a sense amplifier 60 as configured in FIG. 6. In aspects of the invention, a reference ML(REF) is programmed to always be a single bit miss (e.g., a 1-bit miss), which generates the timing for the global precharge signal GPRE that corresponds to the START signal described in FIGS. 4-6. Since a match on any of ML<a> . . . ML<n> needs less time than a 1-bit miss, e.g., on ML(REF), GPRE ensures an adequate global precharge time. The 1-bit miss on ML(REF) also generates a self-timed LATCH signal, which is a delayed version of its evaluate.

Figure 8:
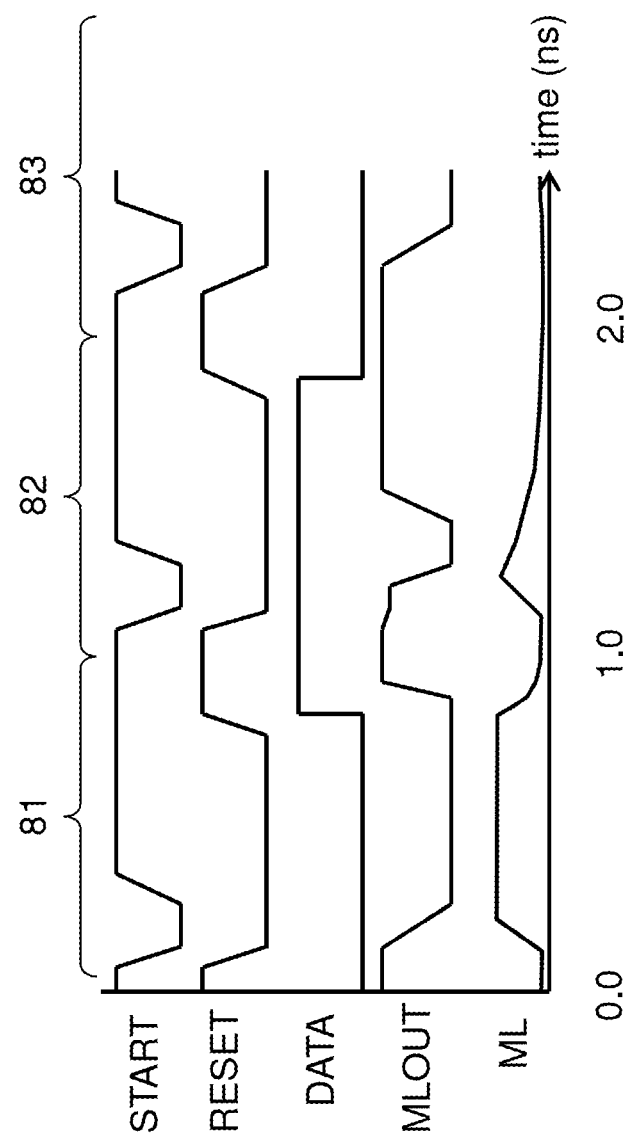
FIG. 8 shows a waveform diagram of exemplary voltage levels of a self-timed sense amplifier in accordance with aspects of the invention.

FIG. 8 shows a waveform diagram of exemplary voltage levels of START, RESET, ML, and MLOUT in accordance with aspects of the invention. In particular, FIG. 8 shows simulated waveforms of START, RESET, ML, and MLOUT of the sense amplifier 60 shown in FIG. 6 as a function of time. In this particular example, the sense amplifier is connected to a matchline with 40 TCAM bits connected to the matchline. The DATA waveform represents a latched data signal based on MLOUT.

Still referring to FIG. 8, the first cycle 81 begins with START and RESET going low just after 1.0 ns, and shows ML staying high and the circuit sensing a match. As shown in FIG. 8, MLOUT transitioning from high to low indicates the self-timed end of the precharge phase of ML. Since first cycle 81 models a match, ML stays high after the end of the precharge. A second cycle 82 modeling a miss (but not an all bit miss) begins with START and RESET going low just after 2.0 ns. Since second cycle 82 models a miss, ML is initially pulled up to the precharge level and then pulled low after the precharge ends. A third cycle 83 modeling an all bit miss begins with START and RESET going low just after 3.0 ns. Since third cycle 83 models an all bit miss, ML never reaches the precharge level. In each cycle 81, 82, and 83, RESET going from low to high at the end of the cycle resets the matchline and the sense amplifier, as well as launches the data (e.g., DATA) out of the capture latch.

Implementations of the invention advantageously provide fast operation due to no need to over-margin the precharge and the ability to quickly enter evaluation mode. Implementations of the invention also advantageously provide low leakage power due to ground voltage level matchlines (or bitlines in case of 8T SRAM) during idle mode. Implementations of the invention further advantageously provide immunity to local variation due to precharging to individual sense amplifier precharge level instead of a globally timed signal. Implementations of the invention further advantageously provide simple implementation because globally timed signals do not determine key timing.

Figure 9:
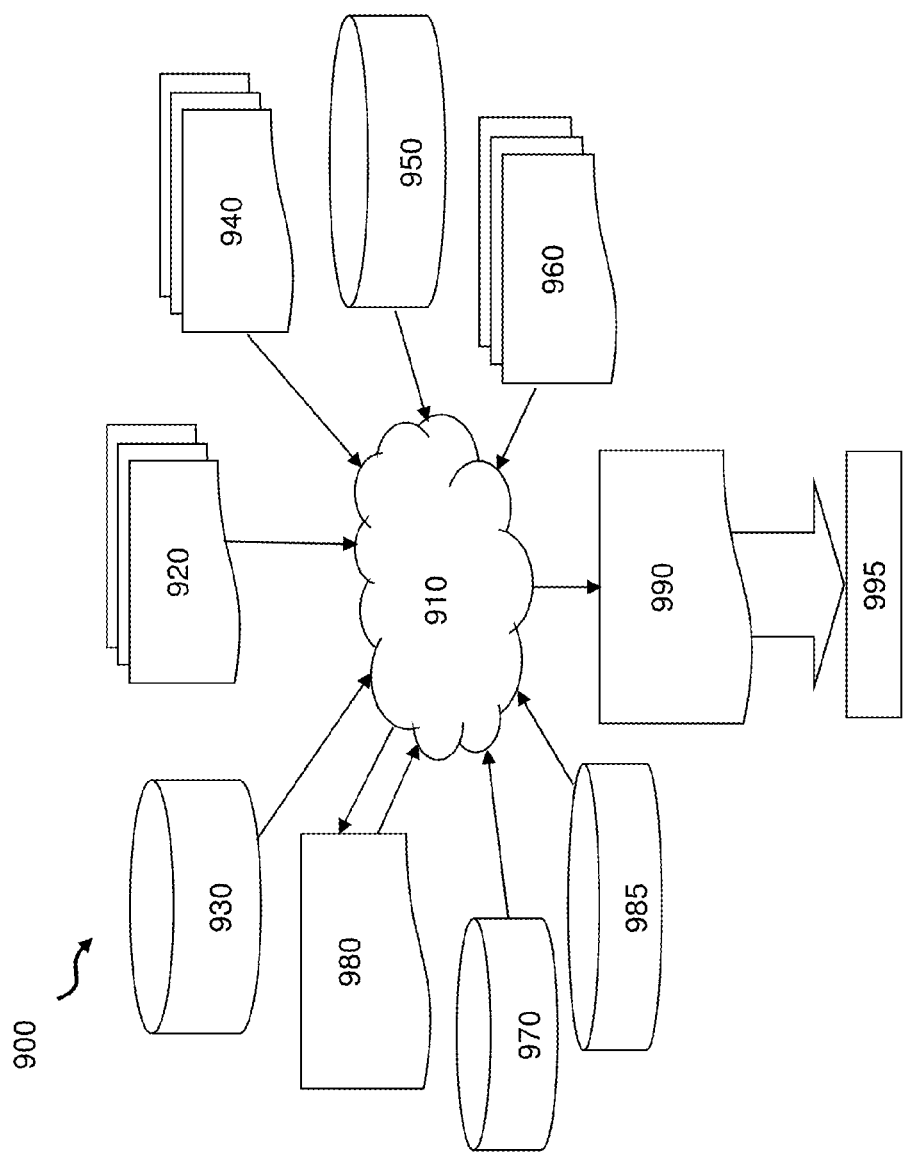
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

What is claimed is:

1. A method of manufacturing an integrated circuit, comprising:
   forming a single-ended sense amplifier connected to a sense line, wherein the sense amplifier is configured to end a precharge phase of the sense line based on a state of the sense amplifier.

2. The method of claim 1, wherein:
   the forming the sense amplifier comprises forming an inverter having an input connected to the sense line;
   the state of the sense amplifier comprises an output of the inverter; and
   the sense amplifier is configured such that a signal that ends the precharge phase is generated based on the output of the inverter transitioning from a first state to a second state.

3. The method of claim 1, wherein:
   the forming the sense amplifier comprises forming a first inverter having a first switch point and a second inverter having a second switch point;
   the first switch point sets a precharge level of the sense line;
   the second switch point sets a sense threshold of the sense line; and
   the first switch point is higher than the second switch point.

4. The method of claim 1, wherein:
   the forming the sense amplifier comprises forming a Schmitt trigger having a first switch point and a second switch point;
   the first switch point sets a precharge level of the sense line;
   the second switch point sets a sense threshold of the sense line; and
   the first switch point is higher than the second switch point.

5. An integrated circuit, comprising:
   a sense amplifier connected to a sense line, wherein the sense amplifier is configured to end a precharge phase of the sense line based on a signal that is generated internally within the sense amplifier.

6. The integrated circuit of claim 5, wherein the sense amplifier is configured to begin the precharge phase based on a signal that is generated externally of the sense amplifier.

7. The integrated circuit of claim 5, wherein the sense amplifier comprises:
   an inverter having an input connected to the sense line;
   a first pFET and a second pFET connected in series between Vdd and the sense line; and
   a first nFET connected between the sense line and ground.

8. The integrated circuit of claim 7, wherein the sense amplifier comprises a third pFET and a second nFET connected in series between Vdd and ground.

9. The integrated circuit of claim 8, wherein:
an output of the inverter is connected to a gate of the third pFET; and
a junction between the third pFET and the second nFET is connected to a gate of the first pFET.

10. The integrated circuit of claim 7, wherein the sense amplifier is structured and arranged such that the precharge phase begins when a start signal applied to a gate of the second pFET transitions from low high to low and a reset signal applied to a gate of the first nFET transitions from low high to low.

11. The integrated circuit of claim 7, wherein the sense amplifier is structured and arranged such that a voltage on the sense line exceeding a switch point of the inverter ends the precharge phase by causing an output of the inverter to turn off the first pFET.

12. The integrated circuit of claim 11, wherein the sense amplifier is structured and arranged such that the ending the precharge phase automatically starts an evaluation phase.

13. The integrated circuit of claim 5, wherein the sense amplifier comprises:
a first inverter having a first switch point; and
a second inverter having a second switch point.

14. The integrated circuit of claim 13, wherein:
the first switch point sets a precharge level of the sense line;
the second switch point sets a sense threshold of the sense line; and
the first switch point is higher than the second switch point.

15. The integrated circuit of claim 5, wherein the sense amplifier comprises a Schmitt trigger having a first switch point and a second switch point.

16. The integrated circuit of claim 15, wherein:
the first switch point sets a precharge level of the sense line;
the second switch point sets a sense threshold of the sense line; and
the first switch point is higher than the second switch point.

17. The integrated circuit of claim 5, wherein the sense amplifier is a single ended sense amplifier.

18. The integrated circuit of claim 5, wherein the sense line is a bitline of an eight-transistor Static Random-Access Memory (8T SRAM).

19. The integrated circuit of claim 5, wherein the sense line is a matchline of a content addressable memory (CAM).

20. A method of evaluating a sense line in an integrated circuit, comprising:
receiving a start signal at a sense amplifier, wherein the start signal is generated externally to the sense amplifier;
beginning a precharge phase of the sense line based on the receiving the start signal; and
ending the precharge phase and beginning an evaluation phase based on a signal that is generated internally within the sense amplifier.

* * * * *